United States Patent
Madan

(10) Patent No.: US 9,972,364 B2
(45) Date of Patent: May 15, 2018

(54) METHOD TO MAINTAIN POWER SUPPLY VOLTAGE DURING BROWNOUT

(75) Inventor: Sudhir K. Madan, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 786 days.

(21) Appl. No.: 13/312,388

(22) Filed: Dec. 6, 2011

(65) Prior Publication Data
US 2013/0093245 A1  Apr. 18, 2013

Related U.S. Application Data

(60) Provisional application No. 61/547,496, filed on Oct. 14, 2011.

(51) Int. Cl.
H02J 9/00 (2006.01)
G11C 5/14 (2006.01)
G11C 11/22 (2006.01)

(52) U.S. Cl.
CPC .......... *G11C 5/145* (2013.01); *G11C 11/22* (2013.01); *Y10T 307/62* (2015.04)

(58) Field of Classification Search
CPC ............................... G11C 11/22; G11C 5/145
USPC ............................................................ 307/65
See application file for complete search history.

(56) References Cited

U.S. PATENT DOCUMENTS

| | | | | | |
|---|---|---|---|---|---|
| 3,946,574 A | * | 3/1976 | Portera | ......... | F25B 49/025 361/22 |
| 4,381,457 A | * | 4/1983 | Wiles | ......... | G06F 1/30 307/64 |
| 5,371,709 A | * | 12/1994 | Fisher | ......... | G11C 5/143 365/226 |
| 5,550,728 A | * | 8/1996 | Ellis | ......... | G11C 5/145 363/60 |
| 5,677,890 A | * | 10/1997 | Liong | ......... | G06F 1/30 365/222 |
| 5,744,388 A | * | 4/1998 | Chen | ......... | H01L 28/92 257/E21.02 |
| 5,864,247 A | * | 1/1999 | Hirano | ......... | G01R 19/0084 327/143 |
| 6,023,187 A | * | 2/2000 | Camacho | ......... | H02M 3/073 327/536 |
| 6,201,731 B1 | * | 3/2001 | Kamp | ......... | G11C 11/22 365/145 |
| 6,304,823 B1 | * | 10/2001 | Smit | ......... | G06F 1/26 702/60 |
| 6,510,071 B2 | * | 1/2003 | Oowaki | ......... | G11C 7/20 365/145 |
| 6,957,158 B1 | * | 10/2005 | Hancock | ......... | G01R 19/2513 340/870.2 |
| 7,193,882 B2 | * | 3/2007 | Takahashi | ......... | G11C 11/22 365/145 |
| 8,437,169 B2 | * | 5/2013 | Xia | ......... | G11C 11/22 365/145 |

(Continued)

*Primary Examiner* — Rexford Barnie
*Assistant Examiner* — Elim Ortiz
(74) *Attorney, Agent, or Firm* — Rose Alyssa Keagy; Charles A. Brill; Frank D. Cimino

(57) ABSTRACT

A method of maintaining a power supply voltage during a brownout is disclosed. The method includes the step of storing a charge in a charge reservoir (608) and storing a charge on a power supply capacitor (832). A charge from the charge reservoir is applied to the power supply capacitor in response to a power supply fail signal (BROWNOUT).

16 Claims, 5 Drawing Sheets

(56) References Cited

U.S. PATENT DOCUMENTS

| | | | |
|---|---|---|---|
| 2005/0270880 A1* | 12/2005 | Hsu | G11C 5/147 |
| | | | 365/226 |
| 2006/0233029 A1* | 10/2006 | Seitz | G05F 3/30 |
| | | | 365/189.11 |
| 2007/0040449 A1* | 2/2007 | Spurlin | A61M 5/14244 |
| | | | 307/64 |
| 2008/0073157 A1* | 3/2008 | Kanon | B66B 5/027 |
| | | | 187/290 |
| 2009/0141523 A1* | 6/2009 | Sugawara | H02M 1/4225 |
| | | | 363/89 |
| 2009/0322418 A1* | 12/2009 | Burke | H03H 15/023 |
| | | | 327/552 |
| 2011/0309889 A1* | 12/2011 | Matsuzaki | H03K 3/017 |
| | | | 331/111 |
| 2012/0155144 A1* | 6/2012 | Xia | G11C 11/22 |
| | | | 365/145 |

* cited by examiner

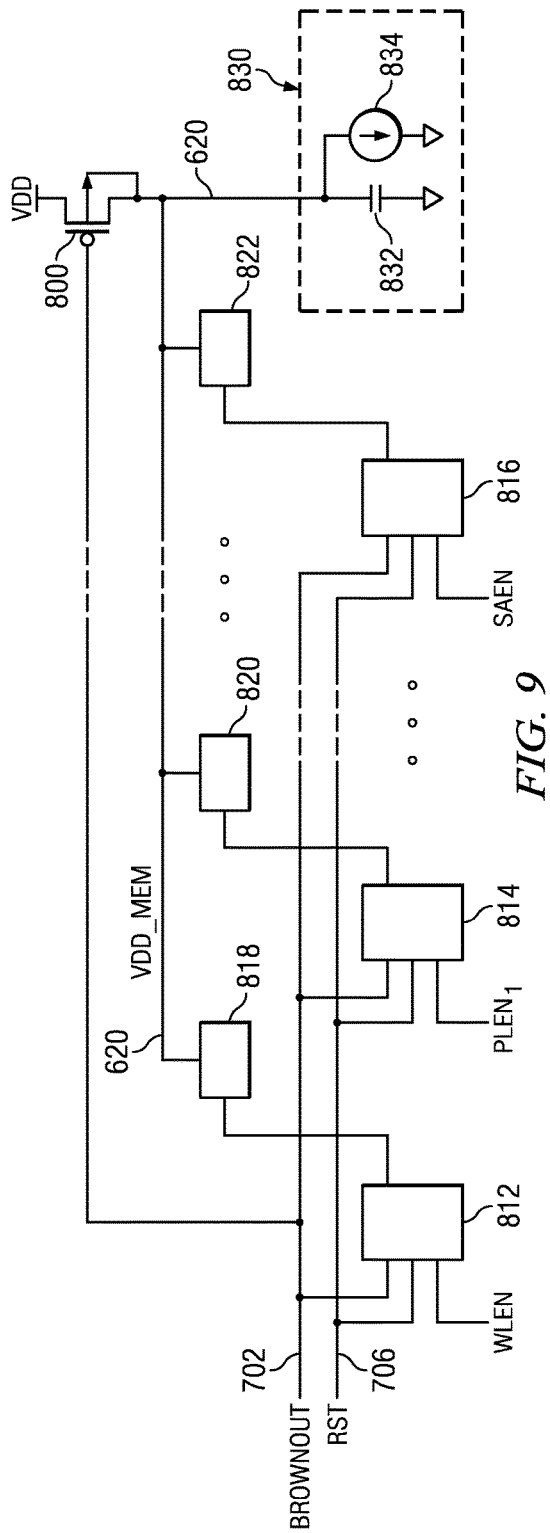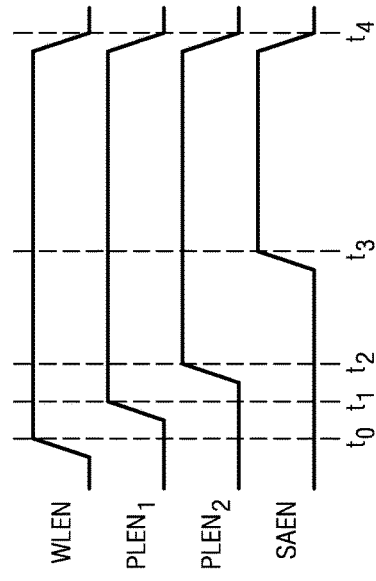

METHOD TO MAINTAIN POWER SUPPLY VOLTAGE DURING BROWNOUT

CLAIM TO PRIORITY OF NONPROVISIONAL APPLICATION

This application claims the benefit under 35 U.S.C. § 119(e) of Provisional Appl. No. 61/547,496 (TI-69575PS), filed Oct. 14, 2011, which is incorporated herein by reference in its entirety.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access lime and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. Memories fabricated from either ferroelectric material have a destructive read operation. In other words, the act of reading a memory cell destroys the stored data so that it must be rewritten before the read operation is terminated. Thus, a power supply interruption or brownout during a read or write operation may produce a data loss in a ferroelectric memory. This is also true for other nonvolatile memories such as flash memories that experience a brownout during a write operation.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0". Therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the voltage across the ferroelectric capacitor is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed. Moreover, power supply voltage across a ferroelectric capacitor must exceed these coercive voltages during a brownout to successfully write or rewrite a desired data state. Otherwise, the data state is lost.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to −Qs. When plateline PL goes high, the voltage across the ferroelectric capacitor is 0V and the stored charge reverts to −Qr. At the end of the write cycle, both bitline BL and plateline PL go low and stored charge −Qr remains on the ferroelectric capacitor. Alternatively, the write "0" occurs when bitline BL remains low and plateline PL goes high. This places a positive voltage across the ferroelectric capacitor and charges it to Qs representing a stored "0". When plateline PL goes low, the voltage across the ferroelectric capacitor is 0 V, and the stored charge reverts to Qr representing a stored "0".

A read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $\Delta t_0$ bitline precharge signal PRE goes low, permitting the bitlines BL to float. At time $\Delta t_1$ both wordline WL and plateline PL go high, thereby permitting each memory cell to share charge with a respective bitline. A stored "1" will share more charge with parasitic bitline capacitance $C_{BL}$ and produce a greater bitline voltage than the stored "0" as shown. A reference voltage is produced at each complementary bitline of an accessed bitline. This reference voltage is between the "1" and "0" voltages. Sense amplifiers are activated at the time boundary between $\Delta t_1$ and $\Delta t_2$. When respective bitline voltages are fully amplified in time $\Delta t_2$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $\Delta t_3$, plateline PL goes low and applies $-V_{max}$ to the read "1" cell, thereby storing $-Qs$. At the same time, zero voltage is applied to the read "0" cell and charge Qr is restored. At the end of time $\Delta t_3$, signal PRE goes high and precharges both bitlines BL to zero volts or ground. Thus, zero volts is applied to the read "1" cell and $-Qr$ is restored.

Referring to FIGS. 5A and 5B, there are timing diagrams illustrating two different types of sensing that may be used in ferroelectric memory circuits. A primary difference between these two schemes is that the step sensing scheme (FIG. 5A) uses a single pulse of plateline PL, while the pulse sensing scheme (FIG. 5B) uses a double pulse of plateline PL. For both types of sensing, bitline precharge signal PRE goes low at time $t_0$, thereby permitting the bitlines BL to float. Next, wordline WL goes high at time $t_1$ to turn on access transistors of a row of memory cells. Plateline PL goes high between times $t_1$ and $t_2$, permitting ferroelectric memory cells share charge with their respective bitlines BL and develop respective difference voltages. Here, $V_1$ represents a data "1" and $V_0$ represents a data "0". The difference voltage available for sensing is the difference between one of $V_1$ and $V_0$ and a reference voltage which lies approximately midway between voltages $V_1$ and $V_0$. This difference voltage is amplified at time $t_3$ for the step sensing scheme (FIG. 5A) so that full bitline BL voltages are developed before the plateline PL goes low at time $t_4$. The data "0" cell is fully restored between time $t_3$ and time $t_4$ while plateline PL is high and the data "0" bitline BL is low. At time $t_4$, the plateline PL goes low while the data "1" bitline BL remains high. Thus, the data "1" cell is restored between time $t_4$ and time $t_5$. Bitline precharge signal PRE goes high at time $t_5$, thereby precharging the bitlines BL to ground or 0 V. The step sensing cycle is completed when wordline WL goes low at time $t_6$ to store respective data in the row of memory cells.

Referring now to FIG. 5B the first pulse of plateline PL develops a difference voltage at time $t_2$. Plateline PL then goes low at time $t_3$, and the common mode difference voltage goes to near 0 V. Then the difference voltage is amplified at time $t_4$, and full bitline BL voltages are developed while the plateline PL is low. Thus, the data "1" cell is restored between time $t_4$ and time $t_5$ while plateline PL is low and the data "1" bitline BL is high. At time $t_5$, the plateline PL goes high while the data "0" bitline BL remains low. Thus, the data "0" cell is restored between time $t_5$ and time $t_6$. The data "1" cell is again restored between time $t_6$ and time $t_7$ while plateline PL is low and the data "1" bitline BL is high. Bitline precharge signal PRE goes high at time $t_7$, thereby precharging the bitlines BL to ground or 0 V. The pulse sensing cycle is completed when wordline WL goes low at time $t_8$.

BRIEF SUMMARY OF THE INVENTION

In a preferred embodiment of the present invention, a method of maintaining a power supply voltage is disclosed. The method includes storing a charge in a charge reservoir and storing a charge on a power supply capacitor. Upon receiving a power fail signal, a charge from the charge reservoir is applied to the power supply capacitor.

BRIEF DESCRIPTION OF THE SEVERAL VIEWS OF THE DRAWING

FIG. 9 is a schematic diagram of another embodiment of a charge pump circuit of the present invention; and FIG. 10 is a timing diagram showing operation of the charge pump circuit of FIG. 9.

DETAILED DESCRIPTION OF THE INVENTION

Figure 1:
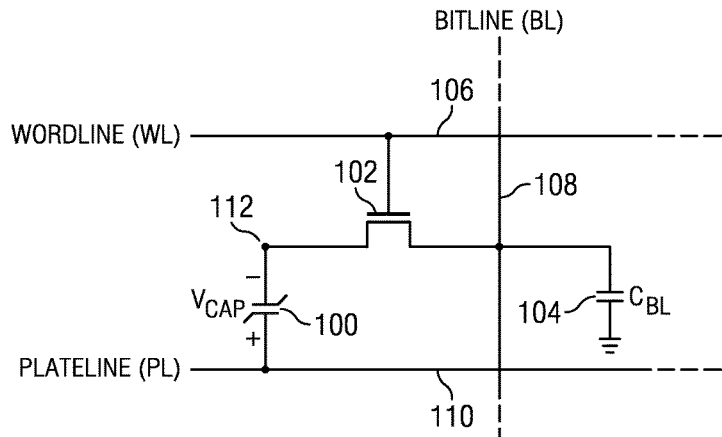
FIG. 1 is a circuit diagram of a ferroelectric memory cell of the prior art.
Figure 2:
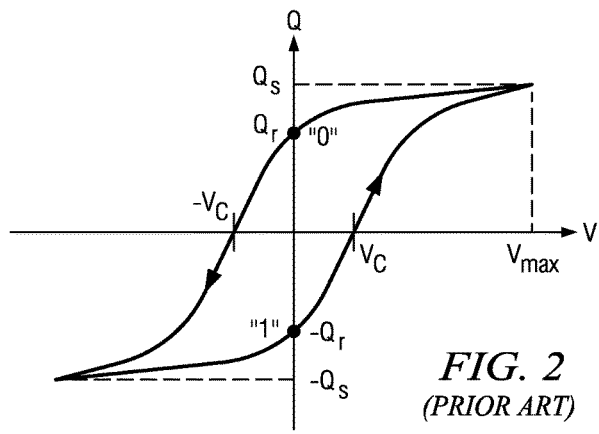
FIG. 2 is a hysteresis curve of the ferroelectric capacitor 100 of FIG. 1.
Figure 3:
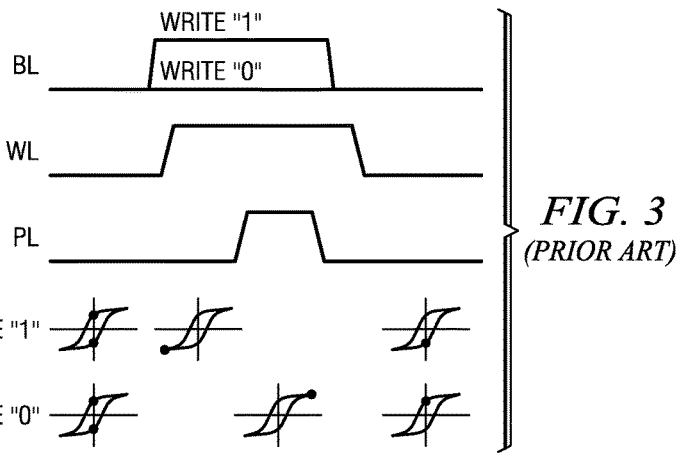
FIG. 3 is a timing diagram showing a write operation to the ferroelectric memory cell of FIG. 1.
Figure 4:
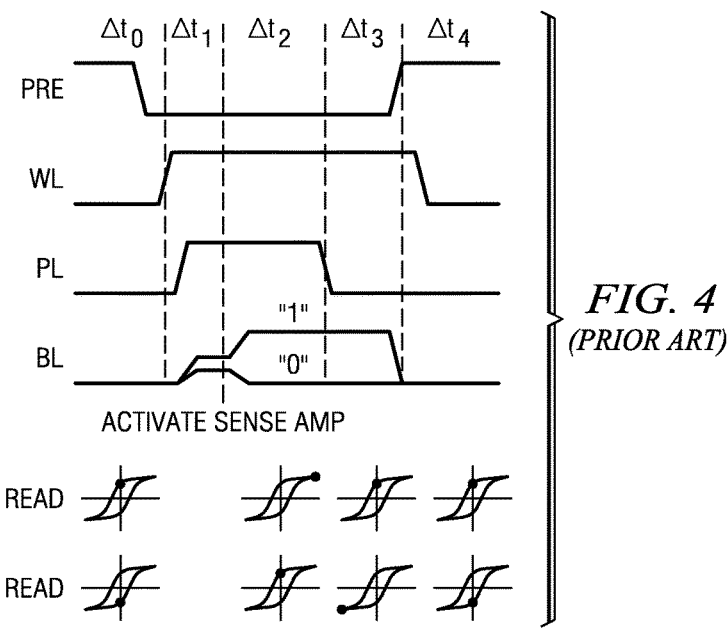
FIG. 4 is a timing diagram showing a read operation from the ferroelectric memory cell of FIG. 1.
Figure 5A:
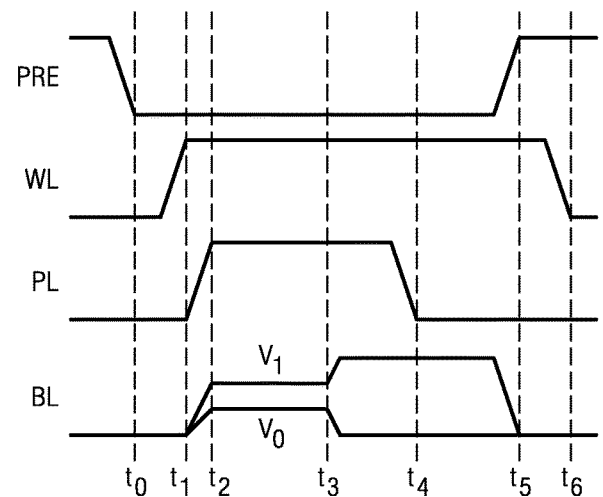
FIG. 5A is a timing diagram of a step sense read cycle.
Figure 5B:
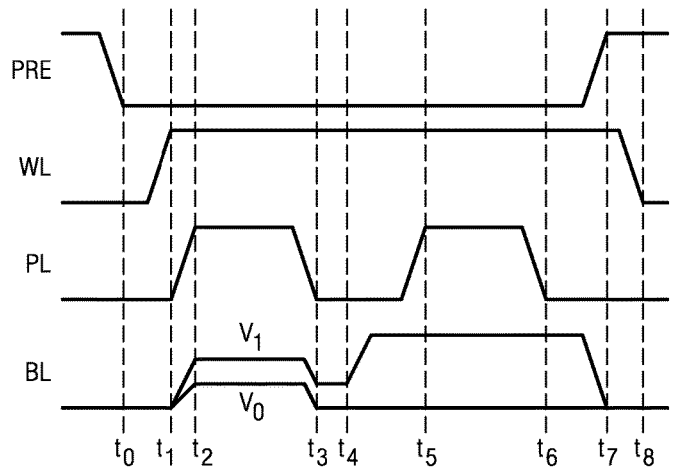
FIG. 5B is a timing diagram of a pulse sense read cycle.

Preferred embodiments of the present invention provide significant advantages in completing read and write operations in nonvolatile memories after a temporary power failure, often referred to as a brownout, in the following discussion, the same reference numerals are used in the drawing figures to indicate common circuit elements.

Figure 8:
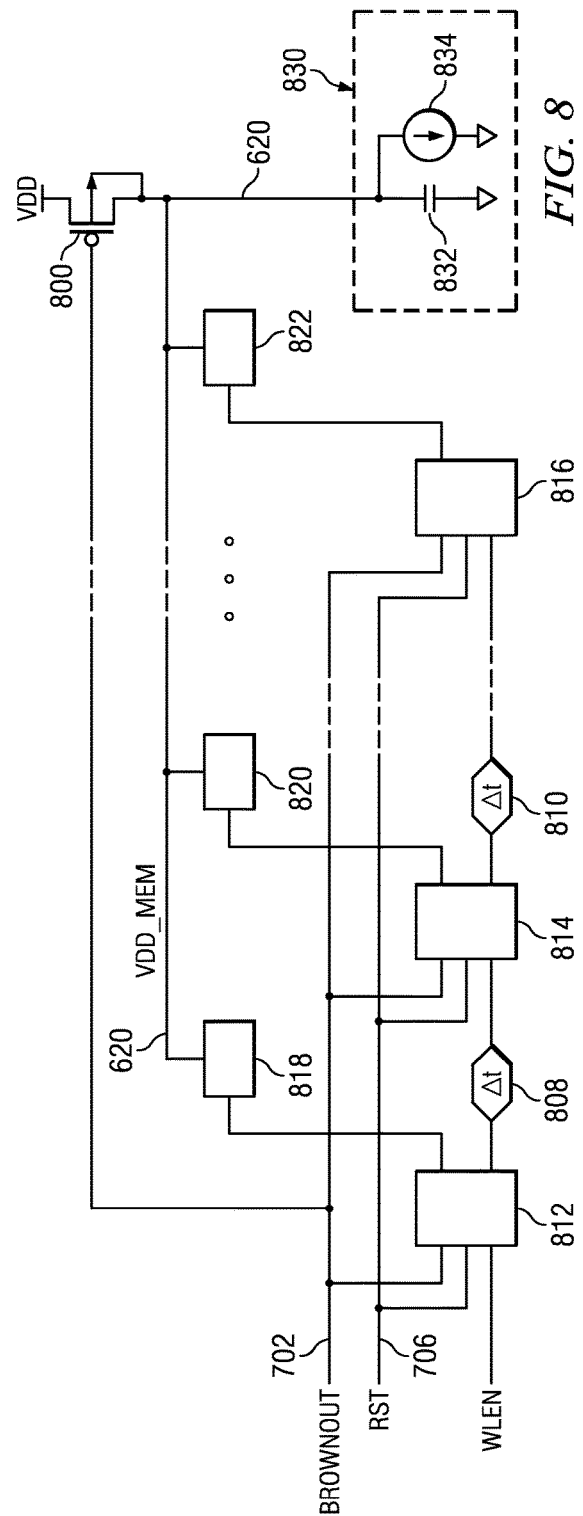
FIG. 8 is a schematic diagram of an embodiment of a charge pump circuit of the present invention.

Referring to FIG. 8, there is a schematic diagram of a power supply circuit of the present invention. Here, a memory circuit 830 is modeled as a power supply capacitor 832 in parallel with a current source 834. The power supply capacitor 832 may include parasitic capacitance as well as thin oxide decoupling capacitors. The current source 834 represents an average current during a read or write operation of the memory circuit. A p-channel transistor 800 couples power supply terminal VDD to the power supply capacitor 832 via lead 620. P-channel transistor 800 has a bulk terminal coupled to lead 620, so the ramp rate of the power supply voltage VDD must be controlled during power up to avoid exceeding a diode drop across the transistor current path. P-channel transistor 800 is preferably surrounded by a P+ guard ring as is known in the art. The power supply voltage on lead 620 or VDD_MEM is dedicated to the memory circuit as well as other circuits in the following discussion. The power supply circuit includes plural pump circuits 818-822 coupled to lead 620. Each pump circuit 818-822 includes a respective control circuit 812-816 as will be discussed in detail. The control circuits 812-816 are each coupled to receive a power fail signal BROWNOUT on lead 702 to indicate a temporary power failure at terminal VDD. The BROWNOUT signal is typically generated by a memory controller and powered by VDD_MEM or another power source which is not impacted by the VDD brownout. Alternatively, the BROWNOUT signal may be generated by the memory circuit by comparing power supply voltage VDD to a predetermined threshold voltage. The control circuits 812-816 are also coupled to receive a reset signal RST on lead 706. The RST signal is preferably a pulse of short duration that is generated at the beginning of each memory access. Control circuit 812 is also coupled to receive wordline enable signal WLEN as will be discussed in detail.

Figure 6A:
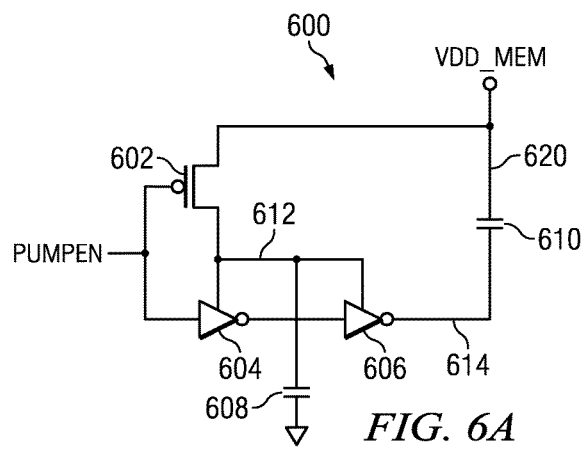
FIG. 6A is a schematic diagram of a charge pump of the present invention.
Figure 6B:
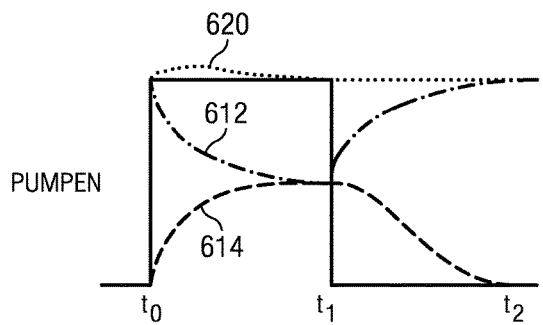
FIG. 6B is a waveform diagram showing operation of the charge pump of FIG. 6A.

Turning now to FIGS. 6A and 6B, pump circuits 818-822 will be described in detail. Each pump circuit 818-822 is substantially the same as pump circuit 600, except that transistor and capacitor sizes may vary. Pump circuit 600 includes p-channel transistor 602 having a control gate coupled to receive pump enable signal PUMPEN. The PUMPEN signal is low during normal operation so that p-channel transistor 602 is on. This charges reservoir capacitor 608 to VDD_MEM. The PUMPEN signal is also applied to inverter 604 and produces a high output signal. The high output signal is applied to inverter 606 to produce a low output at lead 614 of pump capacitor 610. Pump capacitor 610, therefore, is initially charged to VDD_MEM. FIG. 6B illustrates operation of pump circuit 600 in the power supply circuit of FIG. 8 when PUMPEN, indicated by the solid line, goes high at time $t_0$. The high level of PUMPEN turns off p-channel transistor 602, thereby isolating reservoir capacitor 608 from VDD_MEM at lead 620. The high level of PUMPEN also produces a low level at the output of inverter 604 and a corresponding high level at the input of inverter 606. Responsively, the reservoir capacitor 608 partially discharges through inverter 606 as indicated by dashed waveform 612. The output of inverter 606 charges lead 614 as indicated by short dashed waveform 614. The transition of waveform 614 pumps charge onto lead 620 and power supply capacitor 832 as indicated by dotted waveform 620. At time $t_1$, PUMPEN returns to a low level and turns on p-channel transistor 602. This applies VDD_MEM to lead 612 and recharges reservoir capacitor 608. The low level of PUMPEN also produces a low level at lead 614 to recharge pump capacitor 610 to VDD_MEM. Thus, pump circuit 600 returns to its initial state at time $t_2$. In practice, reservoir capacitor 608 and pump capacitor 610 are designed for a predetermined charge transfer with minimum capacitor size. If there is a large difference in size between reservoir capacitor 608 and pump capacitor 610, the smaller capacitor will limit the effectiveness of the larger capacitor. Both capacitors are designed to pump the predetermined charge onto power supply capacitor 832.

Figure 7:
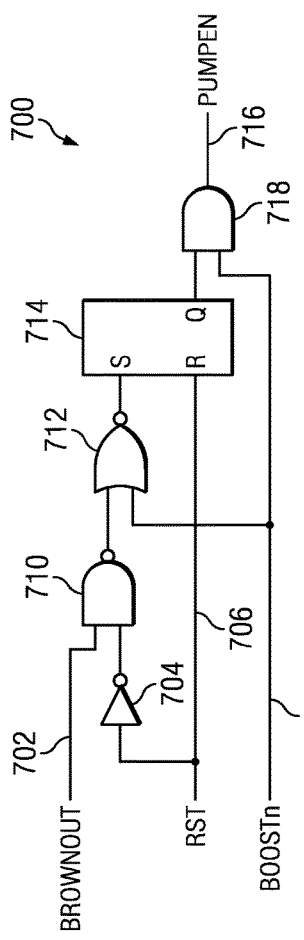
FIG. 7 is a control circuit for the charge pump of FIG. 6A.

Referring now to FIG. 7, there is a schematic diagram of a control circuit 700 that is substantially the same as control circuits 812-816 of FIG. 8. The control circuit produces control signal PUMPER which is applied to a respective pump circuit as shown in FIG. 8. In operation, the high level of RST produces a low level output from inverter 704, a high level output from NAND gate 710, and a low level output from NOR gate 712 at the S input of SR flip flop 714. Together with the high level of RST at the R input, RST resets the SR flip flop at the beginning of each memory access cycle so that the Q output is low. The low Q output produces a low output (PUMPEN) from AND gate 718 at lead 716. The short duration RST pulse then returns low and produces a high output from inverter 704 to enable NAND gate 710. Power fail signal BROWNOUT remains low in normal operation, thereby producing a high level output from NAND gate 710 and a corresponding low level output from NOR gate 712. In this normal mode of operation, PUMPEN remains low as long as power fail signal BROWNOUT remains low without regard to the level of BOOSTn on lead 708. At any time during a memory access cycle, power fail signal BROWNOUT may go high indicating a power failure. This produces a low level output from NAND gate 710 and a high level output from NOR gate 712. The high level at the S input sets SR flip flop 714 to produce a high level at the Q output. Subsequently, when BOOSTn goes high it produces a high level PUMPEN signal from AND gate 718 on lead 716. This high level of PUMPEN enables a respective one of pump circuits 818-822 as previously described.

Returning now to the power control circuit of FIG. 8, control circuit 812 is coupled to receive wordline enable signal WLEN, which corresponds to BOOSTn (FIG. 7) in the previous discussion. WLEN is also applied to delay circuit 808. Delay circuit 808 may include series connected inverters with a capacitor and preferably produces a rising edge delay with a negligible falling edge delay. The output of delay stage 808, a delayed version of the rising edge of WLEN, is then applied to control circuit 814. Responsively, control circuit 814 produces a respective PUMPEN signal to activate pump circuit 820. The output of delay stage 808 is also applied to delay stage 810 to produce a further delayed version of WLEN which is applied to control circuit 816. Responsively, control circuit 816 produces a respective PUMPEN signal to activate pump circuit 822. In this manner, multiple pump circuits such as pump circuits 818-822 may be sequentially activated to maintain power supply voltage VDD_MEM until completion of the memory access cycle. This is highly advantageous for several reasons: First, sequential activation of pump circuits avoids large voltage spikes of VDD_MEM on lead 620. Second, data will not be lost due to an incomplete read or write in a memory access cycle of a nonvolatile memory. Finally, power supply capacitor 832 may be smaller than a comparable decoupling capacitor that would maintain a sufficient voltage of VDD_MEM without the pump circuits.

Turning now to FIGS. 9 and 10, there is another embodiment of the power supply circuit of the present invention. The power supply circuit of FIG. 9 is substantially the same as the power supply circuit of FIG. 8 except that each of control circuits 812-816 is activated by an enable signal for a respective memory circuit. For example, wordline enable signal WLEN activates control circuit 812 as previously discussed at time $t_0$ (FIG. 10). A first plateline enable signal $PLEN_1$ activates control circuit 814 at time $t_1$. A second plateline enable signal $PLEN_2$ activates a second plateline control circuit (not shown) at time $t_2$. At time $t_3$, sense amplifier enable signal SAEN activates control circuit 816. Finally, at time $t_4$ the memory cycle ends and all enable signals return low. The power supply circuit of FIG. 9 offers all the advantages of the power supply circuit of FIG. 8. Additionally, since each control circuit is activated by a respective memory circuit enable signal, both the reservoir capacitor 608 and the pump capacitor 610 of each respective pump circuit 600 may be designed to supply the charge required for that respective memory circuit. For example, the reservoir capacitor 608 and pump capacitor 610 of pump circuit 818 are designed to supply the charge required by the wordline and other circuitry until the next pump circuit 820 is activated. The reservoir capacitor 608 and pump capacitor 610 of pump circuit 820 are designed to supply the charge required by the plateline and other circuitry until the next pump circuit is activated. Likewise, the reservoir capacitor 608 and pump capacitor 610 of pump circuit 822 are designed to supply the charge required by the sense amplifiers and other circuitry for the rest of the access. Thus, power fail signal BROWNOUT may occur any time in the memory cycle, and only the charge required for the remainder of the memory cycle is supplied to the VDD_MEM power supply capacitor 832.

Still further, while numerous examples have thus been provided, one skilled in the art should recognize that various modifications, substitutions, or alterations may be made to the described embodiments while still falling with the inventive scope as defined by the following claims. For example, any number of pump circuits may be used in the previously described embodiments of FIGS. 8 and 9. Moreover, a combination of the embodiments of FIGS. 8 and 9 may be desirable. For example, it may be desirable to sequentially activate more than one pump circuit in response to sense amplifier enable signal SAEN. In this case sequential activation may be accomplished by delayed versions of SAEN. In another example in the circuit of FIG. 7, the leading edge of the BOOSTn signal could be a delayed version of the BROWNOUT signal. Other combinations will be readily apparent to one of ordinary skill in the art having access to the instant specification.

What is claimed is:

1. A method of maintaining a power supply voltage to a memory circuit, comprising:
    storing a charge in a charge reservoir;
    storing a charge on a power supply capacitor of the memory circuit;
    receiving a power supply fail signal generated by a memory controller; and
    applying charge from the charge reservoir to the power supply capacitor in response to the power supply fail signal.

2. A method as in claim 1, wherein the charge reservoir is a capacitor.

3. A method as in claim 1, wherein the power supply capacitor comprises a parallel plate capacitor having a dielectric.

4. A method as in claim 3, wherein the dielectric comprises silicon dioxide.

5. A method as in claim 1, wherein the power supply fail signal is a brownout signal that indicates a temporary power failure.

6. A method as in claim 1, wherein applying charge comprises pumping charge from the charge reservoir through a pump capacitor.

7. A method of maintaining a power supply voltage to a memory circuit, comprising:
    storing a separate charge on each of a plurality of capacitors;
    storing a charge on a power supply capacitor of the memory circuit;
    receiving a power supply fail signal generated by a memory controller;
    receiving a control signal; and
    sequentially applying charge from each capacitor of the plurality of capacitors to the power supply capacitor in response to the power supply fail signal and the control signal.

8. A method as in claim 7, wherein each capacitor of the plurality of capacitors is a same size.

9. A method as in claim 7, wherein each capacitor of the plurality of capacitors is a different size.

10. A method as in claim 7, wherein the power supply fail signal is a brownout signal that indicates a temporary power failure.

11. A method as in claim 7, wherein the control signal is a wordline enable signal.

12. A method as in claim 7, wherein applying charge comprises pumping charge from each capacitor of the plurality of capacitors through a respective pump capacitor.

13. A power supply circuit, comprising:
    a power supply terminal;
    a power supply capacitor of a memory circuit;
    a first transistor coupled between the power supply terminal and the power supply capacitor, the first transistor having a control terminal coupled to receive a power fail signal generated by a memory controller; and
    a plurality of pump circuits coupled to the power supply capacitor, each pump circuit coupled to receive a respective first control signal and to apply charge to the power supply capacitor responsive to its respective first control signal; and
    a plurality of control circuits, each control circuit coupled to a respective pump circuit, each control circuit arranged to produce the respective first control signal in response to a wordline enable signal and to the power fail signal.

14. A power supply circuit as in claim 13, wherein each pump circuit comprises:
    a respective reservoir capacitor; and
    a respective pump capacitor coupled between the respective reservoir capacitor and the power supply capacitor.

15. A power supply circuit as in claim 13, wherein at least one said respective second control signal is a delayed version of a previous said wordline enable signal.

16. A power supply circuit as in claim 13, wherein each said wordline enable signal is an enable signal for a respective memory circuit in the memory circuit.

* * * * *